(12) United States Patent
Kamiya et al.

(10) Patent No.: US 7,044,388 B2
(45) Date of Patent: May 16, 2006

(54) NON-CONTACT IC CARD HAVING ENHANCED RELIABILITY

(75) Inventors: Msashi Kamiya, Kariya (JP); Atsushi Watanabe, Toyokawa (JP)

(73) Assignee: Denso Wave Incorporated, Tokyo (JP)

( * ) Notice: Subject to any disclaimer, the term of this patent is extended or adjusted under 35 U.S.C. 154(b) by 302 days.

(21) Appl. No.: 10/307,449

(22) Filed: Dec. 2, 2002

(65) Prior Publication Data

US 2003/0141590 A1 Jul. 31, 2003

(30) Foreign Application Priority Data

Jan. 28, 2002 (JP) .............................. 2002-018629

(51) Int. Cl.
*G06K 19/06* (2006.01)
(52) U.S. Cl. ...................... 235/492; 235/441
(58) Field of Classification Search ................ 235/492, 235/441; 343/866
See application file for complete search history.

(56) References Cited

U.S. PATENT DOCUMENTS

| 6,412,702 B1 * | 7/2002 | Ishikawa et al. ............. 235/492 |
| 6,422,473 B1 * | 7/2002 | Ikefuji et al. ............... 235/492 |
| 6,522,549 B1 * | 2/2003 | Kano et al. .................. 361/737 |

FOREIGN PATENT DOCUMENTS

| DE | 20110585 | 11/2001 |
| JP | 2001101370 | 4/2001 |

* cited by examiner

*Primary Examiner*—Daniel Stcyr
*Assistant Examiner*—Lisa M. Caputo
(74) *Attorney, Agent, or Firm*—Posz Law Group, PLC

(57) ABSTRACT

To increase the reliability of a non-contact IC card for use in such applications as a door key, etc., two separate combinations of an IC chip and an antenna coil coupled to that chip are provided in the card, with each IC chip storing the same information, such as a key code. Since the probability of both of the IC chips being damaged concurrently due to application of external force is much smaller than the probability of failure of a single IC chip, the objective of enhanced reliability is effectively achieved.

23 Claims, 5 Drawing Sheets

NON-CONTACT IC CARD HAVING ENHANCED RELIABILITY

BACKGROUND OF THE INVENTION

1. Field of Technology

The present invention relates to a non-contact IC (integrated circuit) card having an IC chip and an antenna coil which is connected to the IC chip.

2. Related Prior Art

A non-contact IC card is generally formed with an external cover consisting of two sheets of thin film of an electrically insulating material, an intermediate layer of an attachment material for mutually attaching these sheets, and an antenna coil and an IC chip which are mounted on an inner face of one of the sheets.

With such a prior art type of non-contact IC card, since the IC chip is in the form of a bare chip, the IC chip may become damaged and thereby inoperative, if an external force is applied to the card. For that reason, a reinforcing plate is usually incorporated, mounted over the IC chip, to strengthen the IC chip. However even when such a measure is adopted, the failure rate of such non-contact IC cards is excessively high, being approximately 1%. Such a high failure rate signifies that a sufficiently high degree of reliability cannot be obtained for such non-contact IC cards when these are used in such applications as keys for unlocking vehicle doors or house doors.

SUMMARY OF THE INVENTION

It is an objective of the present invention to overcome the above problem by providing a non-contact IC card having enhanced reliability, due to being less susceptible to damage resulting from application of an external force.

To achieve the above objective, firstly, a non-contact IC card according to the present invention is provided with two independent combinations of an IC chip and an antenna coil which is connected to that IC chip. Since there are two chips, each of which has stored therein the same set of necessary data (e.g. a key code, for use in unlocking a door) the probability of the IC becoming inoperable due to application of external force becomes substantially reduced. That is to say, it is unlikely that both of the IC chips will be destroyed simultaneously. Hence, the reliability of such a non-contact IC card for use in an application such as a door key is substantially increased.

Secondly, such a non-contact IC card can be manufactured by mounting one combination of an IC chip and the corresponding antenna coil one of a pair of sheets of a material that is suitable as the outer cover of an IC card, and mounting the other combination of IC chip and antenna coil on the second one of these sheets. By attaching these sheets with the IC chips and antenna coils enclosed between them, such a non-contact IC card can be easily manufactured.

Alternatively, both of the combinations of IC chip and antenna coil can be mounted on the same one of these two sheets, which also enables such a non-contact IC card to be easily manufactured.

Thirdly, by arranging that the two IC chips are spaced substantially far apart, the reliability is further increased. This is due to the fact that an externally applied force which results in destruction of one of the IC chips is unlikely to also affect the other IC chip.

Fourthly, by making the two antenna coils respectively different in shape, the danger of interference between the two antenna coils can be reduced.

In addition, it is possible to provide the advantage of redundancy with respect to essential data (e.g., a key code) that are stored in the non-contact IC card, together with a capability for storing other data or program contents for which such redundancy is not essential. Specifically, one of the IC chips can be made substantially larger in size (and hence larger in internal circuit scale) than the other, with the essential data being held stored in both of the IC chips, and with other data and program contents, etc., being stored only in the larger IC chip.

Further advantages of the invention will be made clear from the following description of preferred embodiments.

DESCRIPTION OF PREFERRED EMBODIMENTS

Figure 1:
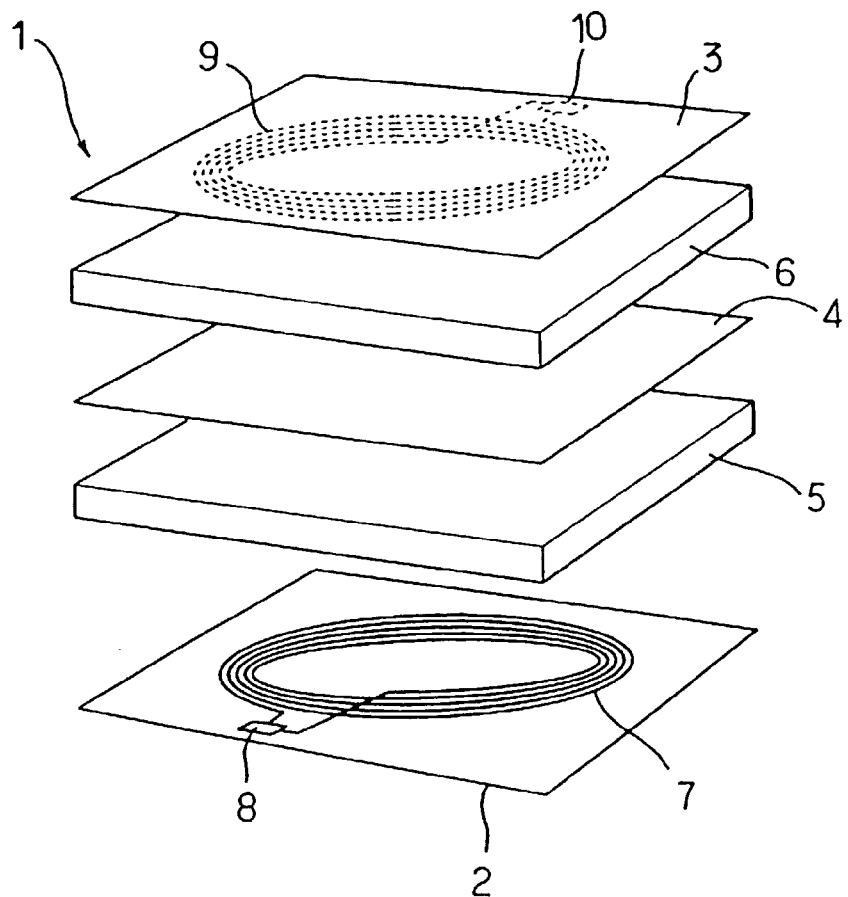
FIG. 1 is an exploded view of a first embodiment of a non-contact IC card.
Figure 2:
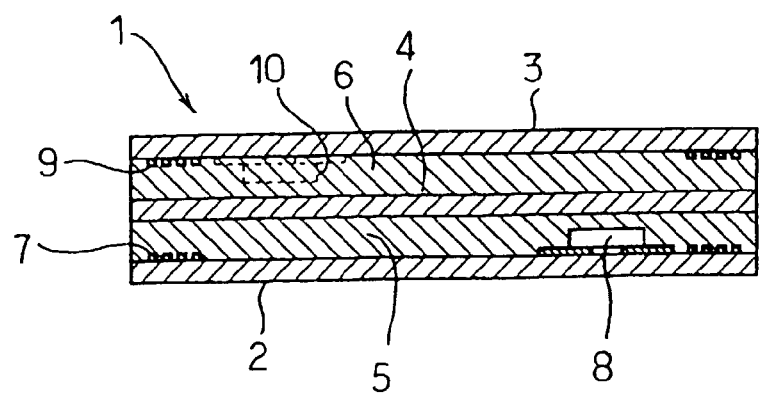
FIG. 2 is a cross-sectional view of the non-contact IC card of the first embodiment.

A first embodiment will be described referring to FIGS. 1 to 3. FIGS. 1 and 2 respectively show an exploded view and a cross-sectional view of this embodiment, which is a non-contact IC card 1. As shown, the non-contact IC card 1 has a sheet 2 constituting a lower-side external cover, a sheet 3 constituting an upper-side external cover, an intermediate sheet 4 disposed between the sheets 2 and 3, an attachment sheet 5 for mutually attaching the sheets 2 and 4, and an attachment sheet 6 for mutually attaching the sheets 3 and 4.

Each of the sheets 2, 3 and 4 is formed of a film of plastic material which is electrically insulating. The mounting face of sheet 2 (i.e., the upper face as seen in FIGS. 1, 2) has a combination of an antenna coil 7 and an IC chip 8 mounted thereon, with the opposing ends of the antenna coil 7 being connected to the IC chip 8. The antenna coil 7 can for example be formed from a electrically conductive paste, using a screen printing technique, or as an electrically conductive pattern of a metallic thin film.

Similarly, the mounting face of sheet 3 (i.e., the lower face as seen in FIGS. 1, 2) has a combination of an antenna coil 9 and a IC chip 10 mounted thereon, with the opposing ends of the antenna coil 9 being connected to the IC chip 10, and with the antenna coil 9 being formed as described above for the antenna coil 7.

With this embodiment, each of the IC chips 8, 10 has the same physical size. It will be assumed that with this embodiment each of the IC chips 8, 10 has the same internal configuration and the same data and program contents held stored therein.

Each of the attachment sheets is formed of a plastic material which melts when subjected to heat, and the embodiment is manufactured by successively stacking the attachment sheet 5, the intermediate sheet 4, the attachment sheet 6 and the sheet 3 on the sheet 2 (with the antenna coil 7 and IC chip 8 having been mounted beforehand on the sheet 2 and the antenna coil 9 and IC chip 10 having been mounted beforehand on the sheet 3), placing the resultant assembly in a thermal press apparatus (not shown in the drawings) and applying heat, to melt the attachment sheets 5 and 6, so that these will flow and fill the spaces between the sheets 3, 4 and the sheets 2, 4. These sheets are thereby left mutually fixedly attached, when cooling subsequently occurs. A non-contact IC card having such a configuration may for example have a thickness of approximately 0.76 mm. Although not shown in the drawings, each of the IC chips 8, 10 preferably has a reinforcing plate mounted over it.

When such a non-contact IC card is brought into an appropriate position relationship with a suitable IC card read/write apparatus (not shown in the drawings), electromagnetic waves emitted by the IC card read/write apparatus induce high-frequency currents to flow in each of the antenna coils 7, 9, which are rectified by circuits within the IC chips 8, 10 respectively, to thereby provide DC power supply voltages for operating these IC chips. The IC chips 8, 10 are thereby activated to begin transmitting/receiving data by radio to/from the IC card read/write apparatus. Although both of the IC chips 8, 10 have the same contents held therein (i.e., data, programs etc.,) the chips are assigned respectively different chip IDs (identification codes). Hence, the IC card read/write apparatus can distinguish between data received from the IC chips 8 and 10, and can communicate respectively separately with these IC chips.

This embodiment will be described referring to the flow diagram of FIG. 3. on the assumption that the non-contact IC card 1 is used as a key, for unlocking a door. In that case, each of the IC chips 8, 10 has stored beforehand therein (i.e., in an internal memory, not shown in the drawings) data constituting a key code, which causes unlocking to be performed when the key code is received by an IC card read/write apparatus (not shown in the drawings) which is mounted on a door such as a house door, and which controls a door lock mechanism. The flow diagram of FIG. 3 shows, in simplified form, the processing which is executed by the IC card read/write apparatus in such a case. Although the case of door unlocking is described, it will be apparent that a door locking operation could be similarly implemented.

Firstly, when the non-contact IC card 1 is appropriately positioned with respect to the IC card read/write apparatus (e.g., inserted into a card slot), a request command is transmitted from the IC card read/write apparatus to the non-contact IC card 1 (step S10). This command is not directed to a specific one of the IC chips 8, 10, but constitutes a request for a predetermined code to be transmitted as a response, from each of these IC chips. A decision is then made (step S20) as to whether or not that response has been received. If no response is received from either of the IC chips 8, 10 then unlocking is not performed, and operation is ended.

However if the response is received (i.e., a YES decision In step S20) then a first predetermined processing sequence referred to in the following as the "slot 1 processing" is assigned to the IC chip 8, and a second predetermined processing sequence referred to in the following as the "slot 2 processing" is assigned to the IC chip 10, i.e., is assigned to the chip ID code corresponding to the IC chip 10 (step S30). With this embodiment, in which each of the IC chips 8, 10 has to same configuration and same stored contents, there is no difference between the slot 1 processing and the slot 2 processing, so that these can be arbitrarily assigned. However it would be equally possible to pre-assign the slot 1 processing to a specific one of the IC chips 8, 10 and the slot 2 processing to the other IC chip.

Next, in step S40 the IC card read/write apparatus transmits a signal conveying an interrogation code (a predetermined code constituting a request for the key code to be transmitted) to the IC chip which has been assigned the slot 1 processing (which will be assumed to be the IC chip 8), i.e., using the chip ID code of that IC chip, and a decision is made as to whether or not the key code has been correctly received in response to the interrogation. If the key code has been correctly received (a YES decision in step S40) then door unlocking is performed (step S50).

If there is a NO decision in step S40, i.e., no key code has been received from IC chip 8, or the received key code is not the correct predetermined code, then step S60 is executed. In this case, the IC card read/write apparatus transmits a signal conveying the aforementioned interrogation code to the IC chip which has been assigned the slot 2 processing (assumed to be the IC chip 10) and a decision is made as to whether or not the key code has been correctly received in response to the interrogation. If the key code has been correctly received (a YES decision in step S60) then door unlocking is performed (step S70), then step S100 is executed, to generate a visible or audible indication that one of the IC chips 8, 10 (in this case, chip 8) is defective, and operation then ends. If the received key code is not the correctly predetermined code (a NO decision in step S60) then no unlocking is performed, and operation is ended.

Following step S50, step S80 is executed, which is identical to step S60 described above, to obtain the key code from the IC chip which has been assigned the slot 2 processing (IC chip 10). If no key code is received from IC chip 10, or the received key code is not the correct predetermined code, then step S100 is executed, to generate a visible or audible indication that one of the IC chips 8, 10 (in this case, chip 10) is defective, and operation then ends.

If a YES decision is made in step S80, then door unlocking is again executed (step S90), although this step could of course be omitted. Operation then ends.

As can be understood from the above, the "slot 1 processing" consists of a processing sequence which begins at step S40, while the "slot 2 processing" begins at either step S60 or step S80, depending upon the results of the slot 2 processing.

The operation of step S100, to generate a warning indication that one of the IC chips 8, 10 is defective, can be implemented for example as a visible indication by a display device, or by an appropriate device for emitting an audible warning sound, which is mounted on the door together with the IC card read/write apparatus.

Figure 3:
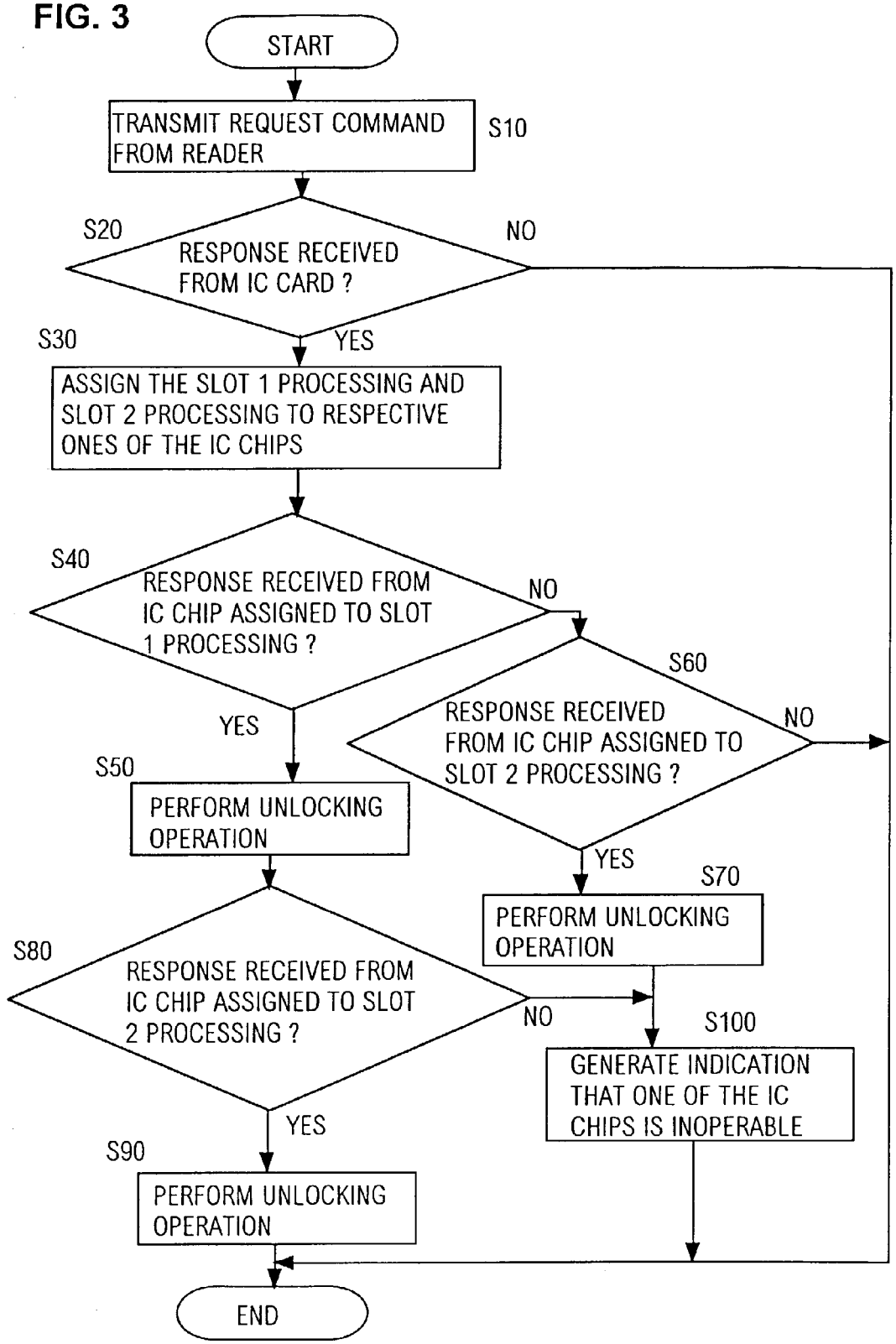
FIG. 3 is a flow diagram for describing the operation of an IC card read/write apparatus which is used in conjunction with a non-contact IC card according to the present invention.

As can be understood from the above, one of the following processes will occur when the non-contact IC card 1 is utilized with an IC card read/write apparatus which functions as shown in the flow diagram of FIG. 3:

(a) If both of the IC chips 8, 10 are defective (a NO decision in step S20), then door unlocking will not occur. No warning indication will be generated.

(b) If neither of the IC chips 8, 10 is defective (so that a YES decision is reached in each of steps S20, S40 and S80, then door unlocking will be performed in step S50.

(c) If only the IC chip assigned to the slot 2 processing is defective (i.e., a YES decision in each of steps S20 and S40, and a NO decision in step S80) then door unlocking will be performed in step S50. A warning indication is generated that one of the IC chips is defective, in step S100.

(d) If only the IC chip assigned to the slot 1 processing is defective (i.e., a YES decision in each of steps S20 and S60, and a NO decision in step S40), then door unlocking will be performed in step S70. A warning indication is generated that one of the IC chips is defective, in step S100.

The user of the non-contact IC card can thereby be notified of the fact that, although the card can continue be utilized for door unlocking at least temporarily, one of the two IC chips in the card has become defective.

With this embodiment, by providing two combinations of an IC chip and an antenna coil in the non-contact IC card 1, substantially increased reliability can be achieved. Specifically, assuming that a prior art type of non-contact IC card having a single combination of an IC chip and antenna coil has a failure rate of approximately 0.1%, the above embodiment, having two combinations of an IC chip and antenna coil in a single non-contact IC card, will have a failure rate of approximately (0.1×0.1)%, i.e., approximately 0.01%. Hence, the degree of reliability against the effects of externally applied force is sufficiently high that such a non-contact IC card can be put into practical use in an application such as a vehicle door key, or house door key.

With the embodiments described above, the combination of the antenna coil 7 and IC chip 8 are mounted on one of the two sheets 2, 3 which constitute the outer cover of the non-contact IC card while the combination of the antenna coil 9 and IC chip 10 are mounted on the other one of these two sheets. Hence, such a non-contact IC card can be readily manufactured. As illustrated in FIG. 1, these components are preferably arranged such that the IC chips 8 and 10 are mutually spaced apart by a substantial distance, e.g., by being disposed at opposite sides of the card (as viewed in plan), on opposite sides of a line of symmetry of the card. If this is done, there will only be a low degree of probability that both of the IC chips will be damaged at the same time, as a result of application of an external force. Hence, the reliability of the non-contact IC card is further increased.

It should be noted that the intermediate sheet 4 of the above embodiment could be omitted, in which case a single layer of an attachment material having sufficient thickness could be utilized in place of the two sheets 5, 6 of that embodiment, between the sheets 2 and 3. Furthermore it is assumed in the above that the order in which the two IC chips of the non-contact IC card are interrogated (i.e., to obtain the key code) is not fixedly predetermined. However it would be possible to arrange that a predetermined one of the IC chips would first be interrogated by the IC card read/write apparatus, then the other one of the IC chips would be interrogated.

Second Embodiment

FIGS. 4A to 4F are diagrams for illustrating a manufacturing process for a second embodiment of a non-contact IC card. Components of this embodiment which are identical to those of the first embodiment are indicated by correspondingly identical reference numerals.

With the second embodiment both of the combinations of the antenna coil 7, IC chip 8 and the antenna coil 9, IC chip 10, are mounted in common on the same one of the two plastic sheets 2, 3 which constitute the covering of the non-contact IC card. In this case it is assumed that both combinations are mounted on sheet 2.

Figure 4A:
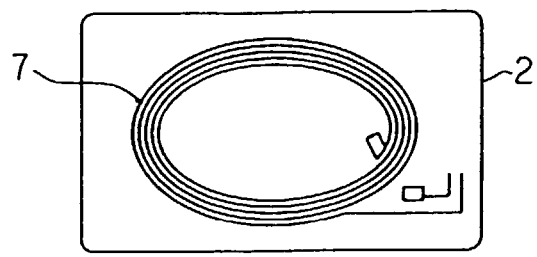
FIGS. 4A to 4F are plan views which illustrate stages in a manufacturing process for a second embodiment.
Figure 4B:
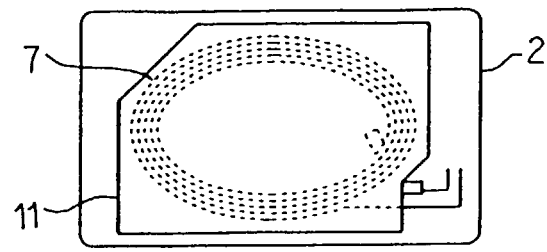

The manufacturing process is as follows. Firstly, as shown in FIG. 4A, one of the antenna coils (antenna coil 7) is formed on the upper face of the sheet 2 by a screen printing process using an electrically conductive paste. Next, as shown in FIG. 4B, an electrically insulating layer 11 is formed over the antenna coil 7 on the upper face of the sheet 2, by a printing process using an electrically insulating paste.

Figure 4C:
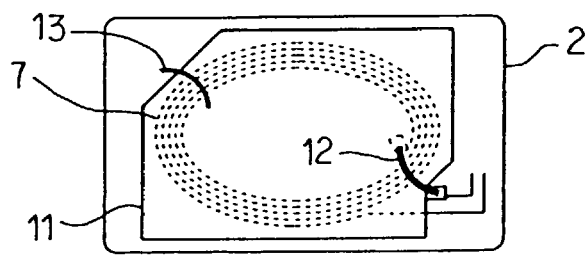
Figure 4D:
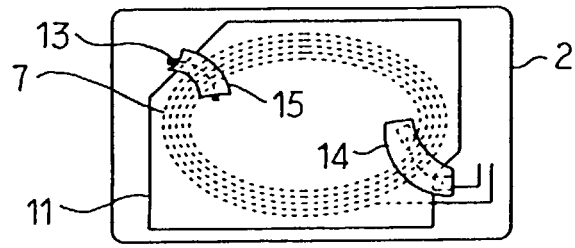
Figure 4E:
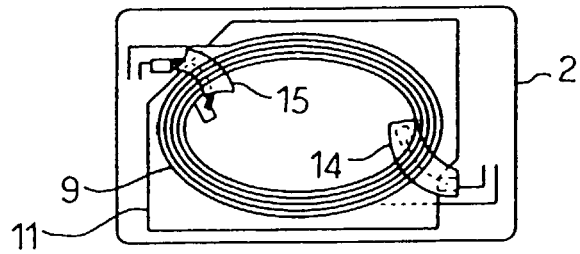

Next, as shown in FIG. 4C, two jumpers 12, 13 are formed on the electrically insulating layer 11, by screen printing using an electrically conductive paste. In the following step as shown in FIG. 4D, two electrically insulating layer portions 14, 15 are respectively formed over the jumpers 12, 13, by printing of an electrically insulating paste. Next, in step 4E, the other antenna coil 9 is formed over the elements 14, 15 by printing of electrically conductive paste.

Figure 4F:
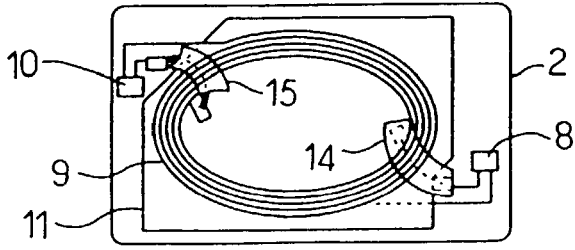

In the final step as shown in FIG. 4F, the two IC chips 8 and 10 are mounted on the upper face of the sheet 2, A sheet of attachment material and the sheet 3 are then successively stacked on the sheet 2, and the resultant assembly is then inserted in a thermal press apparatus and subjected to heat and pressure. The components of the non-contact IC card are thereby mutually fixedly attached.

With the second embodiment, since the configuration of the non-contact IC card is similar to that of the first embodiment, similar advantages are obtained to those described hereinabove for the first embodiment. However with the second embodiment, the manufacturing process is simplified, due to the fact that all of the antenna coils 7, 9 and IC chips 8, 10 are mounted on the same one of the two sheets 2, 3 that constitute the external cover of the card.

Third Embodiment

Figure 5:
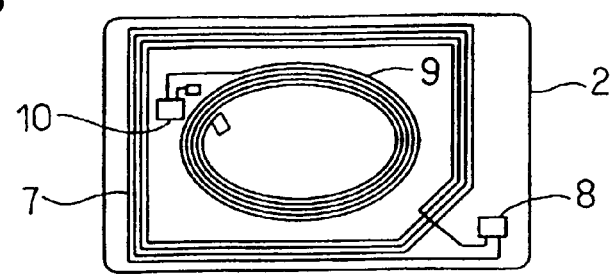
FIG. 5 is a plan view of the interior configuration of a third embodiment.

FIG. 5 is a plan view illustrating a third embodiment of a non-contact IC card (as seen with the sheet 3 removed). Components of this embodiment which are identical to those of the second embodiment are indicated by correspondingly identical reference numerals. With this embodiment, as shown in FIG. 5, both the antenna coils 7 and 9 and the IC chips 8, 10 are formed on the same one of the two sheets 2, 3 which form the cover of the card (in this example, on sheet 2). However the antenna coil 9 and IC chip 10 are disposed within the inner periphery of the antenna coil 7, with the IC chip 8 disposed at the outer periphery of the antenna coil 7.

With the third embodiment, since the configuration of the non-contact IC card is similar to that of the second embodiment, similar advantages are obtained to those described hereinabove for the second embodiment.

Fourth Embodiment

Figure 6:
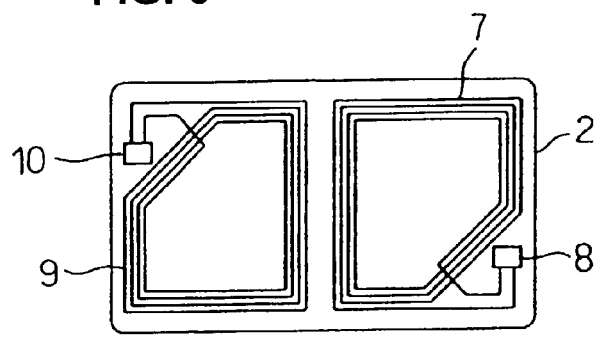
FIG. 6 is a plan view of the interior configuration of a fourth embodiment.

FIG. 6 is a plan view illustrating a fourth embodiment of a non-contact IC card (as seen with the sheet 3 removed). Components of this embodiment which are identical to those of the third embodiment are indicated by correspondingly identical reference numerals. With this embodiment, as shown in FIG. 6, the antenna coil 7 and IC chip 8 are mounted in a region which occupies approximately half of the upper face of one of the two sheets 2, 3 (in this example, sheet 2) while the antenna coil 7 and IC chip 8 are mounted in a region which occupies the remaining half of that upper face of sheet 2.

With the fourth embodiment, it becomes possible to configure the IC card read/write apparatus with an antenna coil arrangement which matches that of the antenna coils 7, 9 of a non-contact IC card 1. In that case, it would be possible for the IC card read/write apparatus to concurrently perform mutually independent transmitting/receiving of data for both the IC chips 8, 10 of a card 1.

Furthermore with the fourth embodiment, if the IC card read/write apparatus has only a single antenna coil, the advantage is obtained that even if a non-contact IC card 1 is not correctly positioned for communicating with the IC card read/write apparatus, it will generally be possible for at least one of the two antenna coils 7, 9 of the card 1 to communicate with the IC card read/write apparatus. Thus, an increase can be achieved in the range of positions of the non-contact IC card (in relation to the IC card read/write apparatus) within which reliable communication can be performed.

Since in other respects the configuration is identical to that of the third embodiment, similar advantages are obtained to those described hereinabove for the third embodiment.

Fifth Embodiment

Figure 7:
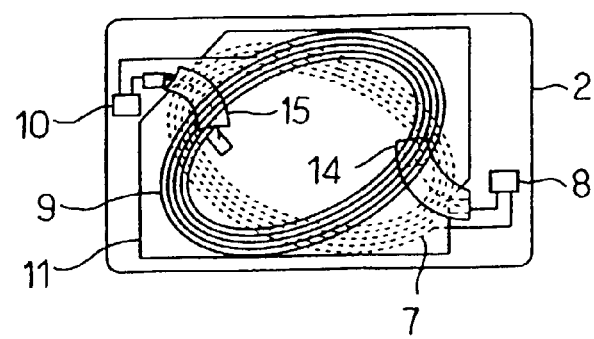
FIG. 7 is a plan view of the interior configuration of a fifth embodiment.
Figure 8:
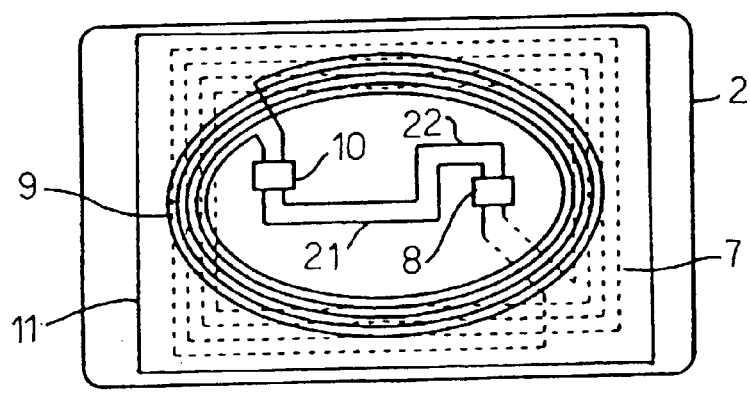
FIG. 8 is a plan view of the interior configuration of a sixth embodiment.

FIG. 7 is a plan view illustrating a fifth embodiment of a non-contact IC card (as seen with the sheet 3 removed). Components of this embodiment which are identical to those of the second embodiment are indicated by correspondingly identical reference numerals. With this embodiment, as shown in FIG. 8, the configuration is identical to that of the second embodiment, other than with respect to the shapes and orientations of the antenna coils 7, 9. In that way, interference between the antenna coils 7, 9 can be reduced. Specifically, each of the antenna coils 7, 9 is formed with an oval shape, and the respective axes of symmetry of the coils are angularly displaced from one another.

In other respect, the configuration of this embodiment is identical to that of the second embodiment, so that similar advantages are obtained to those described hereinabove for the second embodiment.

Sixth Embodiment

FIG. 8 is a plan view illustrating a sixth embodiment of a non-contact IC card (as seen with the sheet 3 removed). Components of this embodiment which are identical to those of the second embodiment are indicated by correspondingly identical reference numerals. With this embodiment, as shown in FIG. 8, the antenna coils 7 and 9 mutually differ in shape, in coil pitch, and in resonance frequency. In addition, connecting leads designated by numerals 21, 22 are coupled between the IC chips 8 and 10 of this embodiment. Each of the IC chips 8, 10 includes a rectifier circuit for deriving a DC supply voltage from electromagnetic waves which are emitted from an IC card read/write apparatus and induce electric power in the corresponding one of the antenna coils 7, 9. In addition, each IC chip 8, 10 includes a power supply interface circuit (not shown in the drawing) which is connected to the connecting leads 20, 21 and is configured such that when the DC supply voltage produced in a first one of the IC chips 8, 10 is of insufficient level, and a sufficiently high level of DC supply voltage is produced in the second IC chip, then that high level of supply voltage is received by the first IC chip via the connecting leads 20, 21.

In other respect, the configuration of this embodiment is identical to that of the second embodiment, so that similar advantages are obtained to those described hereinabove for the second embodiment.

In practice, there may be substantial variations in the shapes of the antenna coils of various different IC card read/write apparatuses. With prior types of noncontact IC card which have only a single antenna coil, that antenna coil may in some cases be of such different shape from that of the antenna coil of an IC card read/write apparatus that communication with the IC card read/write apparatus is impossible. However with the sixth embodiment of the present invention, due to the respectively different shapes of the two antenna coils, it can generally be ensured that a sufficient level of supply power can be derived from at least one of the antenna coils of the non-contact IC card 1, irrespective of variations in shapes of the antenna coils of various different IC card read/write apparatuses. That is to say, in general, even if a sufficiently high level of power cannot be derived from one of the antenna coils, sufficient power will be obtained from the other antenna coil of the non-contact IC card. Hence, the degree of reliability of communication between the non-contact IC card and IC card read/write apparatuses can be increased.

Seventh Embodiment

Although with the above embodiment, each of the IC chips 8, 10 are of identical size and of identical internal configuration, it would be equally possible to arrange that the IC chips are of respectively different size, and are of correspondingly different internal circuit scale. As a specific example, one of the IC chips could be configured to store only the data which are actually required to perform key unlocking (i.e., a key code), with the size of that IC chip being made as small as possible. This will minimize the risk of damage to that chip. The other chip could then be made of sufficient size and internal circuit scale to perform additional processing or data storage functions (i.e., in addition to storing the information for which chip redundancy is required, such as a key code).

Figure 9:
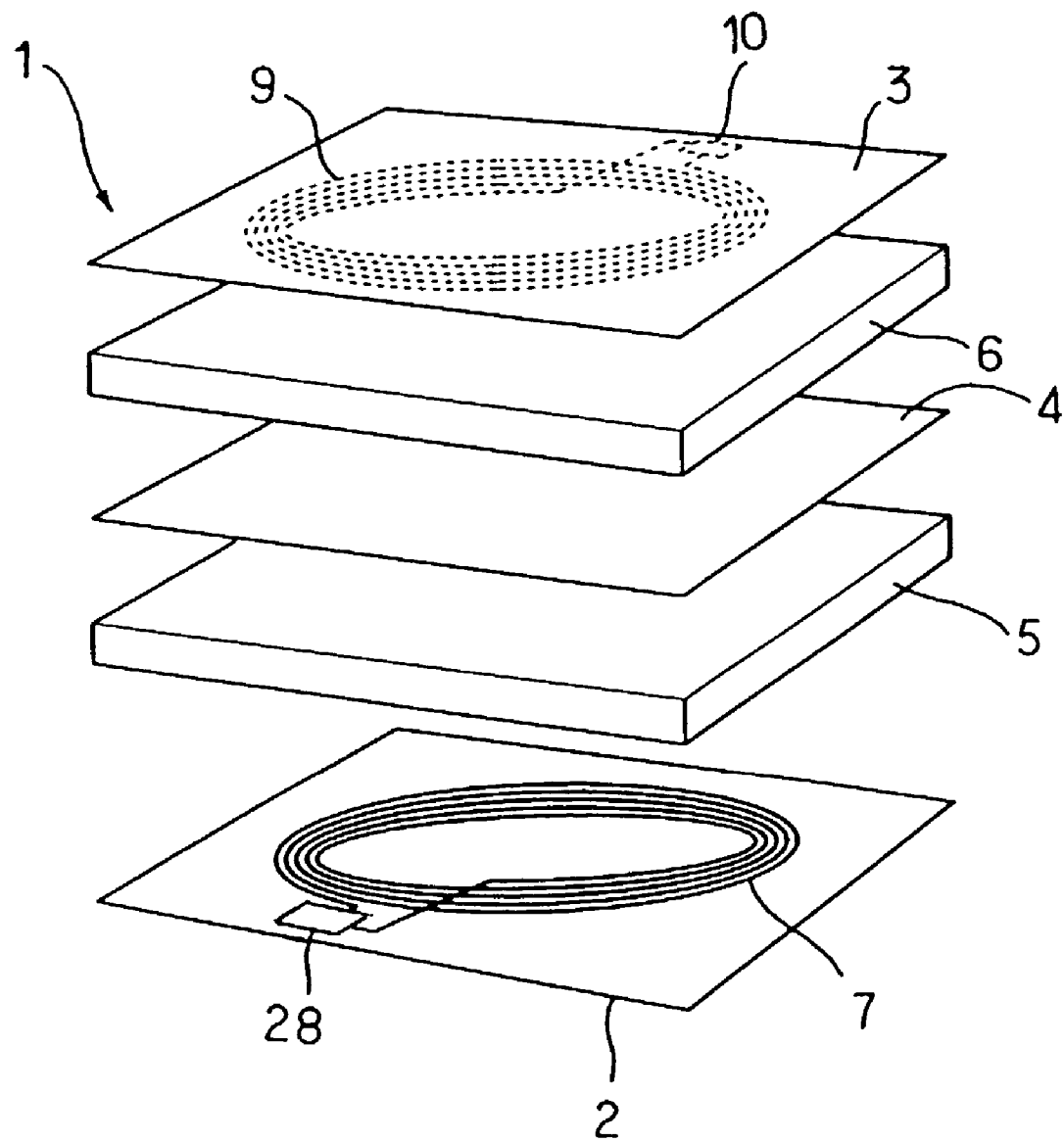
FIG. 9 is an exploded view of the interior configuration of a seventh embodiment.

An embodiment which illustrates this is shown in the exploded diagram of FIG. 9. This differs from the embodiment of FIG. 1 only with respect to the fact that the IC chip 28, which is connected to the antenna coil 7 and is mounted on the sheet 2, is substantially larger in physical size than the other IC chip 10, and hence can be of substantially greater internal circuit scale than the IC chip 10. The IC chip 10 stores only essential information (e.g., key code and associated program contents) as for the first embodiment, whereas the IC chip 28 contains additional circuits and storage capacity and so is capable of storing additional information or programs, etc., as well as the key code. However due to its size, the IC chip 28 is more susceptible to damage due to application of external force to the non-contact IC card.

It will be apparent that such a feature, whereby one of the two IC chips of a non-contact IC card stores only a minimum necessary amount of information and so is smaller in size than the other chip, is equally applicable to each of the other embodiments described above.

It should thus be noted that although the invention has been described referring to specific embodiments, various combinations of the features of these embodiments could be envisaged, which would lie within the scope claimed for the invention. In particular, the features of each of the embodiments of FIGS. 5, 6, 7 and 8 (in which the two antenna coils respectively differ in position, shape, orientation, size, and/or resonance frequency) could equally be applied to a non-contact IC card in which the two combinations of antenna coil and IC chip are mounted on respectively different ones of the outer sheets 2, 3 of the card, as for the first embodiment.

It should further be noted that although the above embodiments have been described for the case in which the non-contact IC card has only a simple data storage and transmission function, e.g, for use as a door key, the invention is equally applicable to a non-contact IC card in which each IC chip has more complex functions.

What is claimed is:

1. A non-contact IC (integrated circuit) card having a combination of an antenna coil and an IC chip, which is connected to said antenna coil, said card comprising a first combination of a first antenna coil and a first IC chip, which Is connected to said first antenna coil, and a second combination of a second antenna coil and a second IC chip, which is connected to said second antenna coil, wherein said card comprises a pair of thin sheets which constitute an outer cover of said card, and wherein said first antenna coil and first IC chip are mounted on first face of a first one of said sheets and said second antenna coil and second IC chip are mounted on a first face of a second one of said sheets, wherein the first face of the first one of the sheets and the first face of the second one of to sheets are opposed and face one another, so that said first antenna coil and said first IC chip and said second antenna coil and said second IC chip are respectively sandwiched between said pair of thin sheets.

2. A non-contact IC card according to claim 1, wherein said first IC chip and second IC chip are disposed spaced substantially distant from one another.

3. A non-contact IC card according to claim 1, wherein said first antenna coil and second antenna coil are formed with respectively different shapes.

4. A non-contact IC card according to claim 3, wherein said first antenna coil and second antenna coil are respectively different in size.

5. A non-contact IC card according to claim 3, wherein said first antenna coil and second antenna coil have respectively different angular orientations.

6. A non-contact IC card according to claim 3, wherein said first antenna coil and second antenna coil are respectively different in pitch.

7. A non-contact IC curd according to claim 3, wherein said first antenna coil and second antenna coil have respectively different resonance frequencies.

8. A non-contact IC card according to claim 3, wherein said first antenna coil is disposed within a region constituting approximately half of the total area of said non-contact IC card, as viewed in plan, and said second antenna coil is disposed within the remainder of said total area.

9. A non-contact IC card according to claim 3, wherein said first IC chip and second IC chip are of substantially identical size and internal configuration.

10. A non-contact IC card according to claim 1, wherein said first IC chip and second IC chip are respectively different in size and in internal configuration.

11. A non-contact IC card according to claim 10, wherein each of said first IC chip and second IC chip has stored therein information which is common to both of said IC chips, and wherein one of said IC chips has further stored therein additional information or program contents.

12. A non-contact IC (integrated circuit) card having a combination of an antenna coil and an IC chip, which is connected to said antenna coil, said card comprising a first combination of a first antenna coil and a first IC chip, which is connected to said first antenna coil, and a second combination of a second antenna coil and a second IC chip, which is connected to said second antenna coil, wherein said card comprises a pair of thin sheets which constitute an outer cover of said card, and wherein said combination of a first antenna coil and first IC chip and said combination of a second antenna coil and second IC chip are mounted in common on one of said sheets with said first antenna coil and said first IC chip and said second antenna coil and said second IC chip respectively sandwiched between said pair of thin sheets.

13. A non-contact IC card according to claim 12, wherein said first IC chip and second IC chip are disposed spaced substantially distant from one another.

14. A non-contact IC card according to claim 12, wherein said first antenna coil and second antenna coil are formed with respectively different shapes.

15. A non-contact IC card according to claim 12, wherein said first antenna coil is of smaller size than said second antenna coil and is disposed within an inner periphery of said second antenna coil.

16. A non-contact IC card according to claim 12, further comprising a layer of electrically insulating material which is sandwiched between said first antenna coil and second antenna coil.

17. A non-contact IC card according to claim 12, wherein said first antenna coil and second antenna coil have respectively different angular orientations.

18. A non-contact IC card according to claim 12, wherein said first antenna coil and second antenna coil are respectively different in pitch.

19. A non-contact IC card according to claim 12, wherein said first antenna coil and second antenna coil have respectively different resonance frequencies.

20. A non-contact IC card according to claim 12, wherein said first antenna coil is disposed within a region constituting approximately half of the total area of said non-contact IC card, and said second antenna coil is disposed within the remainder of said total area.

21. A non-contact IC card according to claim 12, wherein said first IC chip and second IC chip are respectively different in size.

22. A non-contact IC card according to claim 21, wherein each of said first IC chip and second IC chip has stored therein information which is common to both of said IC chips, and wherein one of said IC chips has further stored therein additional information or program contents.

23. A non-contact IC card according to claim 12, wherein each of said first and second IC chips includes rectifier means for deriving a power supply voltage from high-frequency currents which are induced in the corresponding one of said first and second antenna coils by electromagnetic waves emitted from an IC card read/write apparatus, said IC card further comprising:
  in each of said IC chips, interface circuit means for receiving a power supply voltage from the other one of said IC chips under a condition that a locally derived power supply voltage is of insufficient level, and for supplying a power supply voltage to said other one of IC chips under a condition that said locally derived power supply voltage is of sufficient level, and
  connecting leads coupled between said first and second IC chips, for transferring a power supply voltage between said IC chips.

* * * * *